US010122370B2

United States Patent
Bhatta et al.

(10) Patent No.: US 10,122,370 B2
(45) Date of Patent: Nov. 6, 2018

(54) HIGH IMPEDANCE PASSIVE SWITCHED CAPACITOR COMMON MODE FEEDBACK NETWORK

(71) Applicant: QUALCOMM Incorporated, San Diego, CA (US)

(72) Inventors: Debesh Bhatta, San Diego, CA (US); Jeffrey Mark Hinrichs, San Diego, CA (US); Wenjing Yin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/447,680

(22) Filed: Mar. 2, 2017

(65) Prior Publication Data

US 2018/0123602 A1   May 3, 2018

Related U.S. Application Data

(60) Provisional application No. 62/413,916, filed on Oct. 27, 2016.

(51) Int. Cl.
*H03L 7/089* (2006.01)
*H03L 7/23* (2006.01)
*H03G 1/00* (2006.01)

(52) U.S. Cl.
CPC ......... *H03L 7/0891* (2013.01); *H03G 1/0094* (2013.01); *H03L 7/23* (2013.01)

(58) Field of Classification Search
CPC ....... H03L 7/0891; H03L 7/23; H03L 7/0896; H03L 7/0898; H03G 1/0094
See application file for complete search history.

(56) References Cited

U.S. PATENT DOCUMENTS

| 6,697,001 B1 | 2/2004 | Oliaei et al. |
| 8,441,384 B2 | 5/2013 | Lai et al. |
| 8,717,005 B2 | 5/2014 | Schaffer |
| 8,773,184 B1 | 7/2014 | Petrov et al. |

(Continued)

FOREIGN PATENT DOCUMENTS

| CN | 102751956 A | 10/2012 |
| WO | 2017030849 | 2/2017 |

OTHER PUBLICATIONS

International Search Report and Written Opinion—PCT/US2017/053543—ISA/EPO—Jan. 5, 2018.

(Continued)

*Primary Examiner* — Jung Kim
(74) *Attorney, Agent, or Firm* — Qualcomm Incorporated/Seyfarth Shaw LLP

(57) ABSTRACT

A switched capacitor circuit includes a first capacitor coupled in series with a second capacitor in a first mode of operation across differential output terminals of a circuit. The first capacitor and the second capacitor are coupled in an anti-parallel layout in a second mode of operation. The switched capacitor circuit also includes a third capacitor coupled on a first side to a common node of the first capacitor and the second capacitor. The third capacitor is further coupled on a second side to a current source control voltage in the first mode of operation, and coupled between a bias reference voltage and a common mode reference voltage in the second mode of operation.

12 Claims, 11 Drawing Sheets

(56) References Cited

U.S. PATENT DOCUMENTS

| | | | |
|---|---|---|---|
| 8,952,748 B2 | 2/2015 | Guimaraes et al. | |
| 9,086,709 B2 | 7/2015 | Gupta et al. | |
| 9,496,880 B1 * | 11/2016 | Yin | H03L 7/087 |
| 2009/0167437 A1 | 7/2009 | Yeom | |
| 2012/0249237 A1 * | 10/2012 | Garrity | H03F 3/005 |
| | | | 330/127 |

OTHER PUBLICATIONS

Lee I-Y., et al., "Spur Reduction Techniques with a Switched-Capacitor Feedback Differential PLL and a DLL-Based SSCG in UHF RFID Transmitter", IEEE Transactions on Microwave Theory and Techniques, Plenum, USA, vol. 63, No. 4, Apr. 2015, pp. 1202-1210, XP011577410, ISSN: 0018-9480, DOI: 10.11 09/TMTT. 2015.2405536 [retrieved on Apr. 2, 2015].

Xu Z., et al., "A 0.84ps-LSB 2.47mW Time-to-Digital Converter Using Charge Pump and SAR-ADC", Proceedings of be IEEE 2013 Custom Integrated Circuits Conference, IEEE, Sep. 22, 2013 (Sep. 22, 2013), pp. 1-4, KP032524632, DOI: 10.1109/CICC.2013. 6658465 [retrieved on Nov. 7, 2013].

* cited by examiner

HIGH IMPEDANCE PASSIVE SWITCHED CAPACITOR COMMON MODE FEEDBACK NETWORK

CROSS-REFERENCE TO RELATED APPLICATION

The present application claims the benefit of U.S. Provisional Patent Application No. 62/413,916, filed on Oct. 27, 2016, and titled "HIGH IMPEDANCE PASSIVE SWITCHED CAPACITOR COMMON MODE FEEDBACK NETWORK," the disclosure of which is expressly incorporated by reference herein in its entirety.

BACKGROUND

Technical Field

The present disclosure relates generally to electronic circuitry, and more specifically to a high impedance passive switched capacitor common mode feedback network.

Background

The use of fully-differential circuits is becoming more prevalent for high performance analog integrated circuits such as those used in telecommunications and other applications. Fully-differential circuits provide improved rejection of common mode noise and high-frequency power supply variations relative to single-ended implementations. Common mode feedback loops may be employed to provide a stable common mode output voltage.

For low noise differential circuits, it is often desirable to use passive common mode feedback (CMFB) to close the common mode correction loop because passive CMFB has lower flicker noise contribution, larger range of operation, and is easier to design for stable operation. Standard resistive CMFB is undesirable because it loads the output by drawing differential current and has extended settling time for reasonable loading. Conventional switched capacitor networks provide faster settling but present a significant differential load on the output node, and thus are not suitable for high impedance applications, such as a differential charge pump of a phase locked loop (PLL) circuit.

SUMMARY

In an aspect of the present disclosure, a switched capacitor circuit is presented. The switched capacitor circuit includes a first capacitor coupled in series with a second capacitor in a first mode of operation across differential output terminals of a circuit. The first capacitor and the second capacitor are coupled in an anti-parallel layout in a second mode of operation. The switched capacitor circuit also includes a third capacitor coupled on a first side to a common node of the first capacitor and the second capacitor. The third capacitor is further coupled on a second side to a current source control voltage in the first mode of operation, and coupled between a bias reference voltage and a common mode reference voltage in the second mode of operation.

In another aspect of the present disclosure, a method is presented. The method includes comparing a sensed common mode voltage to a desired common mode voltage in a first phase of operation. The method also includes coupling a first capacitor to a second capacitor in an anti-parallel layout in a second phase of operation to maintain a differential charge across the first capacitor and the second capacitor. Furthermore, the method includes updating the sensed common mode voltage based on the comparing during the second phase of operation.

In yet another aspect of the present disclosure, a switched capacitor circuit is presented. The switched capacitor circuit includes means for comparing a sensed common mode voltage to a desired common mode voltage in a first phase of operation. The switched capacitor circuit also includes means for coupling a first capacitor to a second capacitor in an anti-parallel layout in a second phase of operation to maintain a differential charge across the first capacitor and the second capacitor. The switched capacitor circuit further includes means for updating the sensed common mode voltage based on comparing during the second phase of operation.

In still another aspect of the present disclosure, a phase locked loop circuit is presented. The phase locked loop circuit includes a first circuit having differential output terminals and a switched capacitor circuit. The switched capacitor circuit includes a first capacitor coupled in series with a second capacitor in a first mode of operation across the differential output terminals of the first circuit. The first capacitor and the second capacitor are coupled in an anti-parallel layout in a second mode of operation. The switched capacitor circuit also includes a third capacitor. The third capacitor is coupled on a first side to a common node of the first capacitor and the second capacitor and on a second side to a current source control voltage in the first mode of operation. Additionally, the third capacitor is coupled between a bias reference voltage and a common mode reference voltage in the second mode of operation.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

Aspects and features of the present disclosure will be more apparent by describing example aspects with reference to the accompanying drawings, in which.

DETAILED DESCRIPTION

While a number of aspects are described herein, these aspects are presented by way of example only, and are not intended to limit the scope of protection. The apparatuses and methods described herein may be embodied in a variety of other forms. Furthermore, various omissions, substitutions, and changes in the form of the example apparatuses and methods described herein may be made without departing from the scope of protection. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Aspects of the present disclosure are directed to a high impedance passive switched capacitor common mode feedback (CMFB) network. In accordance with aspects of the present disclosure, the switched capacitor CMFB network beneficially provides fast settling with reduced differential loading of the output node.

Figure 1:
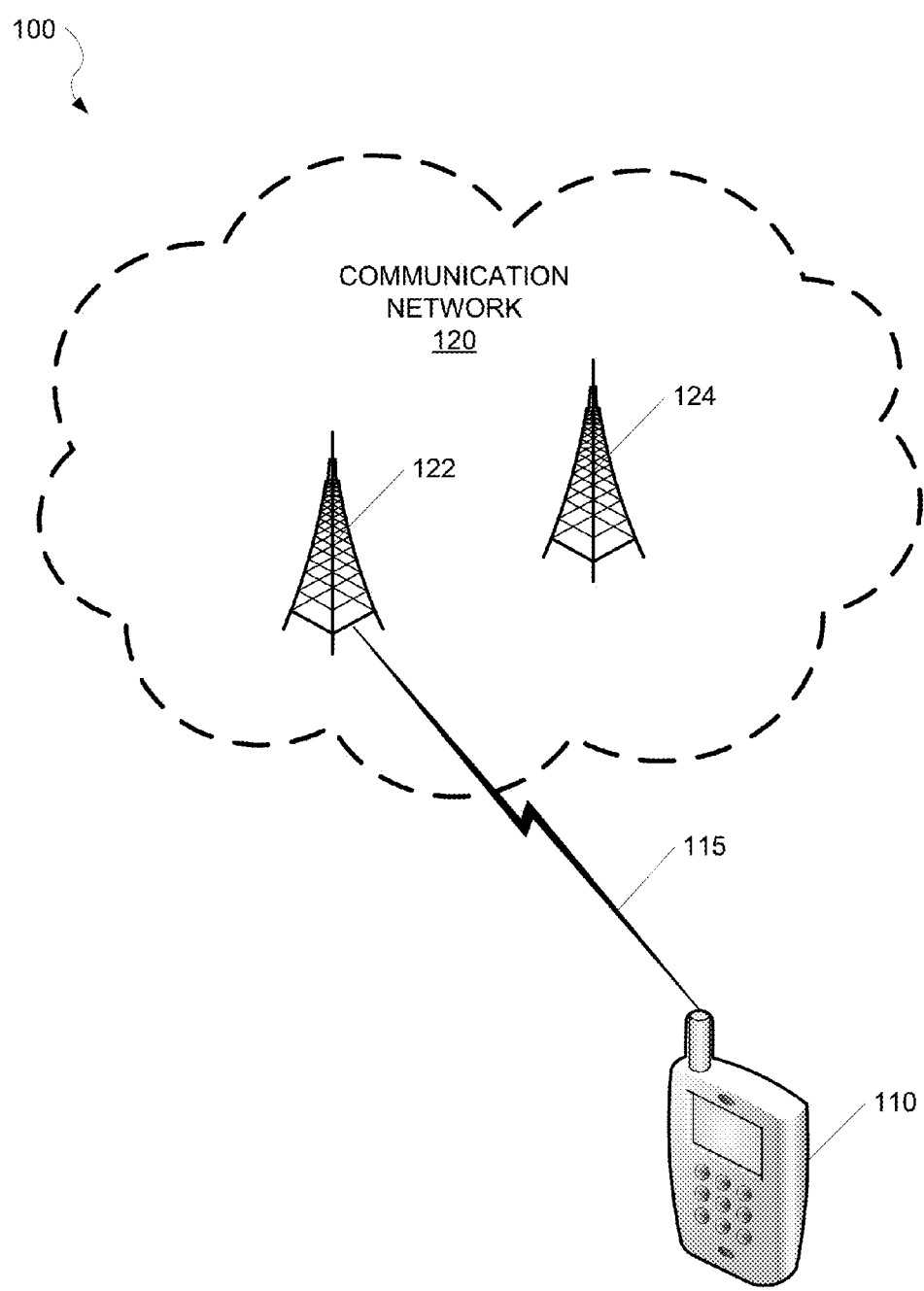
FIG. 1 is a system diagram illustrating a network environment according to various aspects of the present disclosure.

FIG. 1 is a system diagram illustrating an exemplary network environment 100 in accordance with aspects of the present disclosure. A communication network 120 may include one or more evolved universal mobile telecommunications system (UMTS) terrestrial radio access (E-UTRA) Node Bs (eNodeBs) including, for example, but not limited to, a first eNodeB 122 and a second eNodeB 124. The communication network 120 may be, for example, but not limited to, a wireless or mobile communication network.

The communication network 120 may be a long term evolution (LTE) communication network. However, a person having ordinary skill in the art can appreciate that the communication network 120 may support different and/or additional radio access technologies (RATs), including, for example, but not limited to, wideband code division multiple access (WCDMA), global system for mobile communications (GSM), and time division-synchronous code division multiple access (TD-SCDMA) without departing from the scope of the present disclosure.

A mobile communication device 110 may communicate with the communication network 120 on a subscription 115 via the first eNodeB 122. For example, the mobile communication device 110 may transmit data to and receive data from the communication network 120 via the first eNodeB 122. A person having ordinary skill in the art can appreciate that the mobile communication device 110 may communicate with the communication network 120 on the subscription 115 via a different eNodeB (e.g., the second eNodeB 124) without departing from the scope of the present disclosure. Moreover, a person having ordinary skill in the art can appreciate that the mobile communication device 110 may communicate with different and/or additional communication networks on the subscription 115 and/or a different subscription without departing from the scope of the present disclosure.

Figure 2:
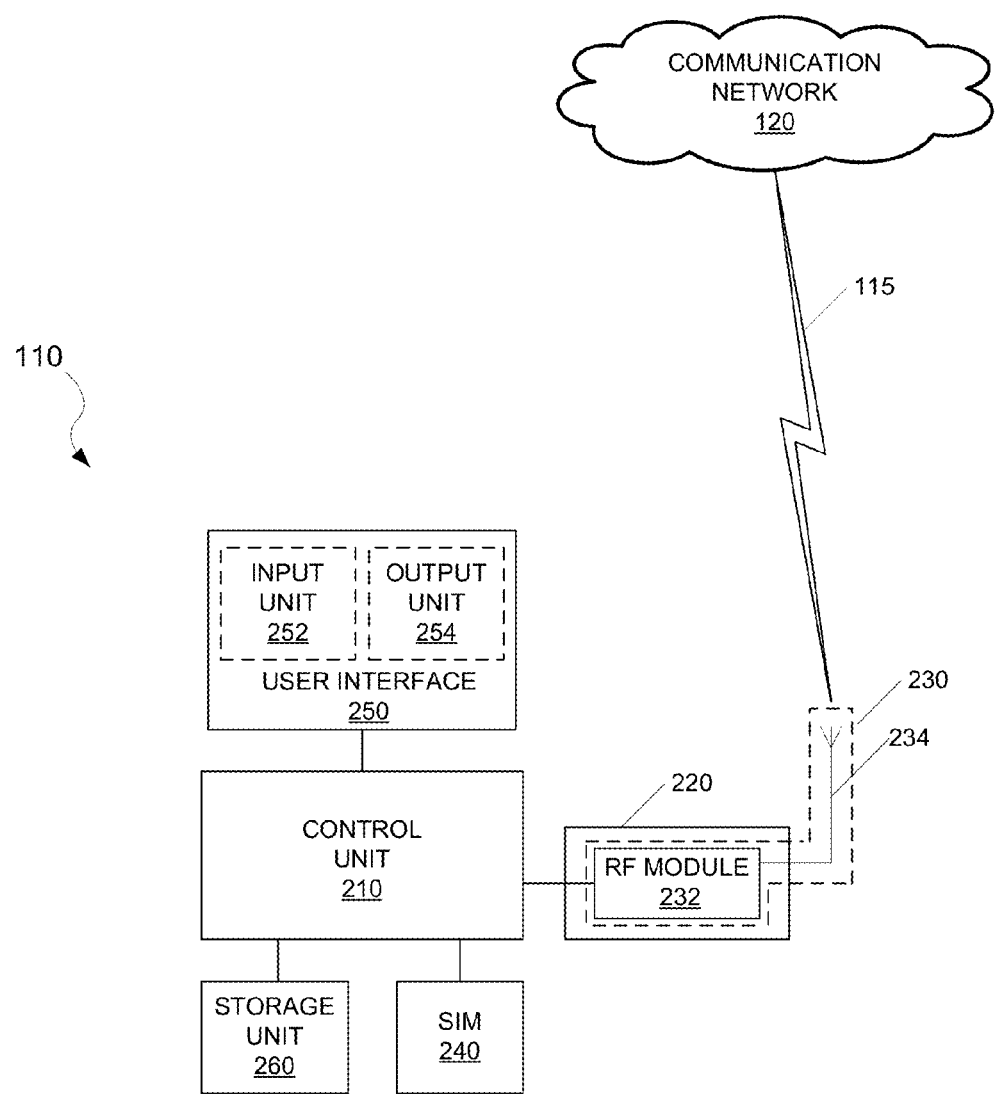
FIG. 2 is a block diagram illustrating a mobile communication device according to various aspects of the present disclosure.

FIG. 2 is a block diagram illustrating an exemplary mobile communication device 110 in accordance with aspects of the present disclosure. Referring to FIGS. 1 and 2, the mobile communication device 110 may include a control unit 210, a communication unit 220, a subscriber identity module (SIM) 240, a user interface 250, and a storage unit 260.

The mobile communication device 110 may be any device capable of wirelessly communicating with one or more communication networks including, for example, but not limited to, the communication network 120. The mobile communication device 110 may be, for example, but is not limited to, a smartphone, a tablet PC, or a laptop computer.

The SIM 240 may associate the communication unit 220 with the subscription 115 on the communication network 120. Although the mobile communication device 110 is shown to include a single SIM (e.g., the SIM 240), a person having ordinary skill in the art can appreciate that the mobile communication device 110 may include additional SIMs without departing from the scope of the present disclosure. The additional SIMs may associate the communication unit 220 with a different subscription on the communication network 120 or a different communication network.

The SIM 240 may be a universal integrated circuit card (UICC) that is configured with SIM and/or universal SIM (USIM) applications, enabling access to GSM and/or UMTS networks. The UICC may also provide storage for a phone book and other applications. Alternatively, in a CDMA network, a SIM may be a UICC removable user identity module (R-UIM) or a CDMA subscriber identity module (CSIM) on a card. A SIM card may have a central processing unit (CPU), read-only memory (ROM), random-access memory (RAM), electrically erasable programmable read-only memory (EEPROM) and input/output (I/O) circuits. An integrated circuit card identity (ICCID) SIM serial number may be printed on the SIM card for identification. However, a SIM may be implemented within a portion of memory of the mobile communication device 110, and thus need not be a separate or removable circuit, chip, or card.

The communication unit 220 may include an RF chain 230. The RF chain 230 may include, for example, but is not limited to, an RF module 232 and an antenna 234. Although the mobile communication device 110 is shown to include a single communication unit (e.g., the communication unit 220), a person having ordinary skill in the art can appreciate that the mobile communication device 110 may include additional communication units without departing from the scope of the present disclosure.

The user interface 250 may include an input unit 252. The input unit 252 may be, for example, but not limited to, a keyboard or a touch screen. The user interface 250 may further include an output unit 254. The output unit 254 may be, for example, but is not limited to, a liquid crystal display (LCD) or a light emitting diode (LED) display. A person having ordinary skill in the art will appreciate that other types or forms of input and output units may be used without departing from the scope of the present disclosure.

The control unit 210 may be configured to control the overall operation of the mobile communication device 110 including controlling the functions of the communication unit 220 including, for example, but not limited to, frequency synthesis performed by the RF module 232. The control unit 210 may be, for example, but is not limited to, a microprocessor (e.g., general-purpose processor, baseband modem processor, etc.) or a microcontroller.

The storage unit 260 may be configured to store application programs, application data, and user data. At least some of the application programs stored at the storage unit 260 may be executed by the control unit 210 for the operation of the mobile communication device 110.

Figure 3:
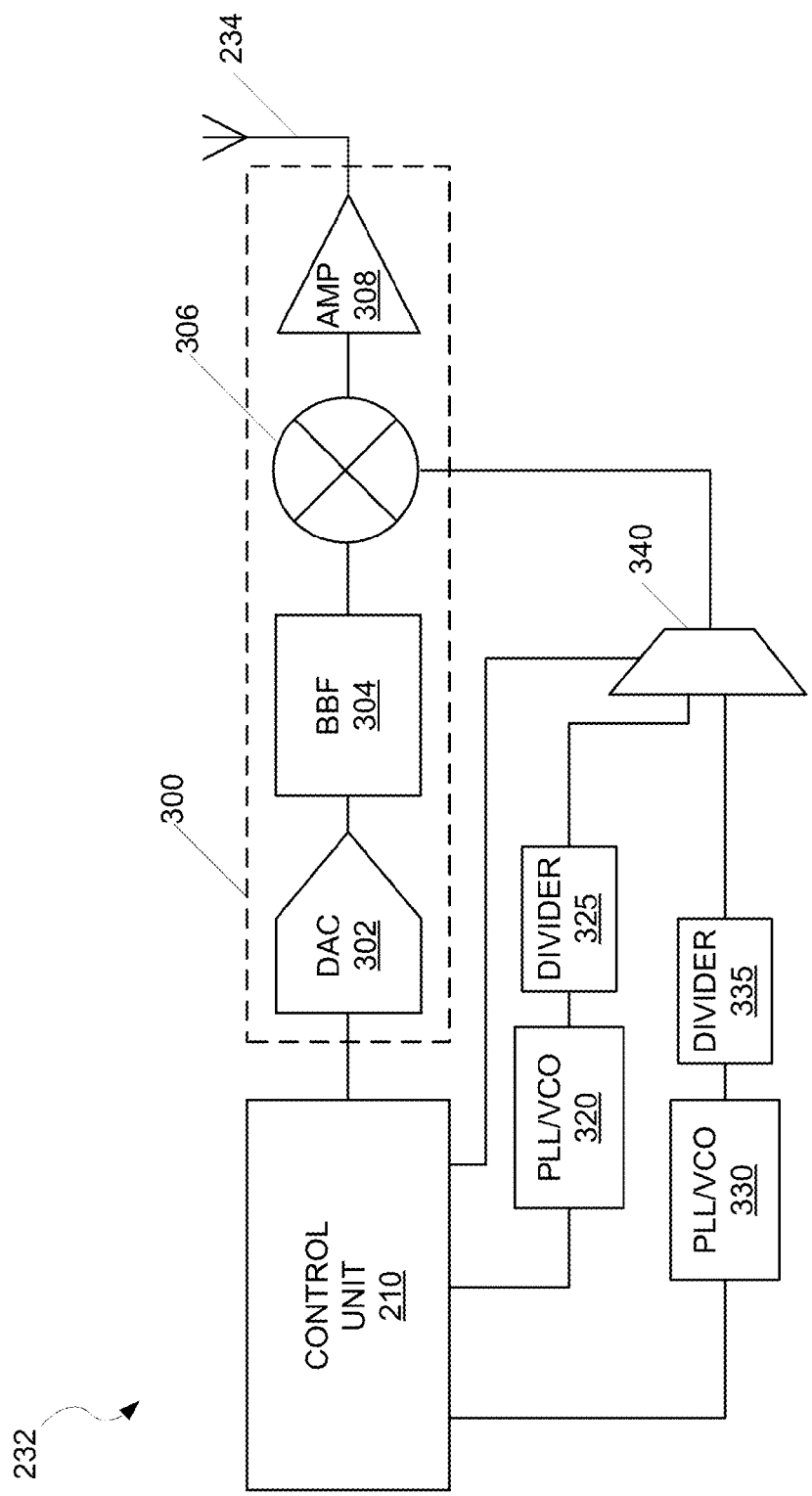
FIG. 3 is a block diagram illustrating a radio frequency (RF) module according to some aspects of the present disclosure.

FIG. 3 is a block diagram illustrating the RF module 232 according to some aspects. Referring to FIGS. 1, 2, and 3, the RF module 232 may include a transmit path 300 and a phase locked loop (PLL) selector 340.

Phase locked loops are used in telecommunications, computers and other electronics applications that utilize a precise clock for coordinating and synchronizing activities. A phase locked loop (PLL) forces an oscillator (e.g., voltage controlled oscillator (VCO) or digitally controlled oscillator (DCO)) to replicate or track a reference frequency and phase at an input when the PLL is in lock configuration. When locked, the frequencies of the input (e.g., at a phase detector) and output (e.g., at a VCO) are tracked exactly (e.g., input frequency=output frequency). A phase offset, however, may exist between the input and output.

A PLL reference frequency may be derived from a local oscillator (e.g., crystal oscillator (XO)). For example, a frequency of the crystal oscillator may be around tens of megahertz (MHz) while a frequency of the VCO may be specified to generate a periodic signal in the GHz range. In this case, a frequency divider by N is interposed between the VCO and the phase detector. When locked, the frequencies at an output of the PLL (e.g., at a VCO) track exactly at a fractional N times the frequency at an input of the PLL (e.g., at a phase detector). For example, N*input frequency is equal to the output frequency. Thus, the output frequency of the VCO is set at a fractional multiple of the frequency by the frequency divider. The frequency divider modulus control might be scrambled by a digital delta-sigma modulator (DSM). That is, a conventional fractional PLL is implemented using DSM dithering in the feedback frequency divider with the phase quantization step equal to one VCO period. It may be desirable for the output of the frequency divider to match the input of a reference frequency. In conventional PLLs, it is very difficult to precisely match the input and instead it may take multiple cycles, which on average produce the desired frequency.

In one aspect of the disclosure, a PLL feedback system includes a VCO, a phase frequency detector (PFD), a charge pump, a loop filter (e.g., low pass filter), and a feedback frequency divider (e.g., integer-N synthesizer or fractional synthesizer) with multiple outputs. The PLL system may be integrated in a mobile communication device. For example, the PLL system may be implemented in a radio frequency (RF) module of the mobile communication device.

The outputs of the feedback frequency divider may be supplied to the phase detector, which may be coupled to the loop filter via the charge pump. The loop filter may be coupled to the VCO. The VCO, in turn, may be coupled to the frequency divider and the frequency divider may be coupled to the phase detector to form the feedback loop (closed loop). The output of the VCO may be a frequency sinusoid that is controlled by a tuning voltage, Vtune, which is received by the VCO from the loop filter. For example, changing the tuning voltage changes the frequency of the VCO. To synthesize a desirable or exact frequency of the VCO, the VCO is included in the closed loop to feed back the VCO signal to the frequency divider. The phase detector compares an output of the frequency divider with a signal generated by the local oscillator.

For example, if the reference frequency of a crystal oscillator is 40 MHz and the output of the VCO is 4 GHz, the frequency divider receives the 4 GHz output of the VCO. The frequency divider is programmed to divide by 100 to provide an output frequency to the phase detector that matches the reference frequency received at the phase detector. The phase detector compares a phase of the reference frequency and the output frequency of the frequency divider and generates an error signal, proportional to a phase difference between the two frequencies. In some implementations, an analog multiplier or mixer can be used as a phase detector. Because the reference frequency and the output from the frequency divider are the same when the loop is locked, the output of the phase detector contains a low-frequency component and additional noise at high frequencies. The low-frequency component is proportional to the phase difference. The high-frequency component is removed by the low pass filter. Any phase difference may be presented as a control voltage (e.g., tuning voltage (Vtune)) to the VCO after filtering.

The RF module 232 may further include local oscillators (LO). The oscillators may comprise multiple phase locked loops (PLLs) with corresponding voltage controlled oscillators (VCOs) (PLL/VCOs) including, for example, but not limited to, a first PLL/VCO 320 and a second PLL/VCO 330. According to one exemplary aspect, the RF module 232 may include two PLL/VCOs (e.g., the first PLL/VCO 320 and the second PLL/VCO 330).

The first PLL/VCO 320 may be coupled with a first divider 325. The first PLL/VCO 320 may receive a reference signal having a reference frequency $F_{ref}$ from the control unit 210 and output a signal to the first divider 325. The combination of the first PLL/VCO 320 and the first divider 325 may be configured to generate and output a frequency divided signal that is synchronized to the phase and the frequency (e.g., $F_{ref}$) of the reference signal.

The second PLL/VCO 330 may be coupled with a second divider 335. The second PLL/VCO 330 may receive a reference signal having a reference frequency $F_{ref}$ from the control unit 210 and output a signal to the second divider 335. The combination of the second PLL/VCO 330 and the second divider 335 may be configured to generate and output a signal that is synchronized to the phase and the frequency (e.g., $F_{ref}$) of the reference signal.

In one implementation, an output signal from a PLL/VCO may be an undivided output signal, thus allowing for the omission of dividers.

The mobile communication device 110 may transmit data to the communication network 120 via the transmit path 300 according to a current resource block (RB) allocation. The control unit 210 may receive from the communication network 120 an upcoming RB allocation for the mobile communication device 110. For example, the control unit 210 may be notified of the upcoming RB allocation on the physical downlink control channel (PDCCH) in advance (e.g., 4-8 slot periods).

The upcoming RB allocation may be different from a current RB allocation. For example, the upcoming RB allocation may have a different bandwidth and/or frequency range than the current RB allocation. A single RB may have a bandwidth of about 180 kHz, but other bandwidths may be used.

In one aspect, in order for the mobile communication device 110 to transmit data according to the upcoming RB allocation, the control unit 210 may select one of the first PLL/VCO 320 and the second PLL/VCO 330 that is not currently in use. The control unit 210 may tune the selected one of the first PLL/VCO 320 and the second PLL/VCO 330 to a target frequency based on a bandwidth of the upcoming RB allocation (e.g., number of allocated RBs).

For example, if the bandwidth of the upcoming RB allocation is narrow (e.g., number of allocated RBs less than or equal to a threshold x, where x may be equal to 6 or another integer value), the control unit 210 may tune the selected one of the first PLL/VCO 320 and the second PLL/VCO 330 to a frequency corresponding to the allocated RBs (e.g., center frequency of the allocated RBs).

In one exemplary aspect, the control unit 210 may determine the frequency corresponding to the upcoming RB allocation based on a lookup table (LUT). For example, the control unit 210 may determine, based on the LUT, the target frequency to tune the selected one of the first PLL/VCO 320 and the second PLL/VCO 330 in order for the mobile communication device 110 to transmit data in accordance with the upcoming RB allocation. In various aspects, the LUT may provide correlations between one or more RB allocations (e.g., in each frequency band) and target frequencies to tune each of a the PLL/VCOs including, for example, but not limited to, the first PLL/VCO 320 and/or the second PLL/VCO 330.

Alternately, if the bandwidth of the upcoming RB allocation is not narrow (e.g., number of allocated RBs greater than x, where x may be equal to 6 or another integer value), the control unit 210 may tune the selected one of the first PLL/VCO 320 and the second PLL/VCO 330 to a frequency corresponding to an assigned channel (e.g., center frequency of assigned E-UTRA absolute radio frequency channel number (EARFCN)).

The control unit 210 may perform coarse tuning (CT) calibration on the selected one of the first PLL/VCO 320 and the second PLL/VCO 330 in order to achieve the target frequency (e.g., frequency corresponding to allocated RBs or to assigned EARFCN). In some aspects, the control unit 210 may perform CT calibration on the selected one of the first PLL/VCO 320 and the second PLL/VCO 330, and allow the selected one of the first PLL/VCO 320 and the second PLL/VCO 330 to settle to the target frequency. Alternately, in some aspects, the control unit 210 may perform CT calibration on the selected one of the first PLL/VCO 320 and the second PLL/VCO 330, and perform two-point modulation (TPM) to achieve the target frequency.

The PLL selector 340 may be configured to receive one or more control signals from the control unit 210. According to one exemplary aspect, the PLL selector 340 may select a frequency divided signal generated by the first PLL/VCO 320 and the first divider 325 or by the second PLL/VCO 330 and by the second divider 335 to output to the transmit path 300 based on the one or more control signals from the control unit 210. The control unit 210 may be configured to cause the PLL selector 340 to perform the switch while a first symbol (e.g., symbol #0) is transmitted by the mobile communication device 110 according to the upcoming RB allocation. Additionally, the switch may be performed during a transmission of a cyclic prefix (CP) of a symbol (e.g., symbol #0).

The transmit path 300 may include a digital to analog converter (DAC) 302 configured to receive a digital signal from the control unit 210 and convert the digital signal into an analog signal. The transmit path 300 may further include a baseband filter (BBF) 304. The BBF 304 may be configured to receive the analog signal from the DAC 302. The BBF 304 may be further configured to receive one or more control signals from the control unit 210. Based on the one or more control signals from the control unit 210, the BBF 304 may be configured to modify a bandwidth of the analog signal received from the DAC 302 to produce a baseband signal (e.g., a filtered analog signal).

The transmit path 300 may include a mixer 306. The mixer 306 may be configured to modulate the frequency divided signal from the PLL selector 340 with the baseband signal from the BBF 304 to generate an up-converted signal. In some aspects, when the bandwidth of RB allocation is narrow (e.g., number of allocated RBs less or equal to x), the frequency divided signal from the PLL selector 340 may be at a frequency corresponding to the upcoming RB allocation (e.g., center frequency of upcoming RB allocation). Alternately, when the bandwidth of the RB allocation is not narrow (e.g., number of allocated RBs greater than x), the frequency divided signal from the PLL selector 340 may correspond to the assigned channel (e.g., center frequency of assigned EARFCN). The up-converted signal may have a frequency corresponding to the upcoming RB allocation (e.g., center frequency of upcoming RB allocation).

In various aspects, the BBF 304 may be configured to produce a baseband signal based on a specified frequency of the RB allocation and a tuned frequency of the frequency divided signal received at the transmit path 300 (e.g., from the PLL selector 340). For example, the frequency of the baseband signal generated by the BBF 304 may be adjusted such that modulating the baseband signal with the frequency divided signal generates an up-converted signal at the specified frequency of the upcoming RB allocation (e.g., center frequency of upcoming RB allocation).

The transmit path 300 may further include an amplifier (amp) 308. The amp 308 may be configured to amplify the up-converted signal from the mixer 306 for transmission.

The antenna 234 may receive the amplified signal from the amp 308 and transmit the amplified signal. For example, an amplified signal from the amp 308 may be transmitted to the communication network 120 (e.g., the first eNodeB 122 or the second eNodeB 124) on the subscription 115 via the antenna 234.

A person having ordinary skill in the art can appreciate that the RF module 232 may include additional and/or different components than shown in FIG. 3 without departing from the scope of the present disclosure. For example, although not shown, a person having ordinary skill in the art can appreciate that the RF module 232 may additionally include a receive path without departing from the scope of the present disclosure.

Figure 4:
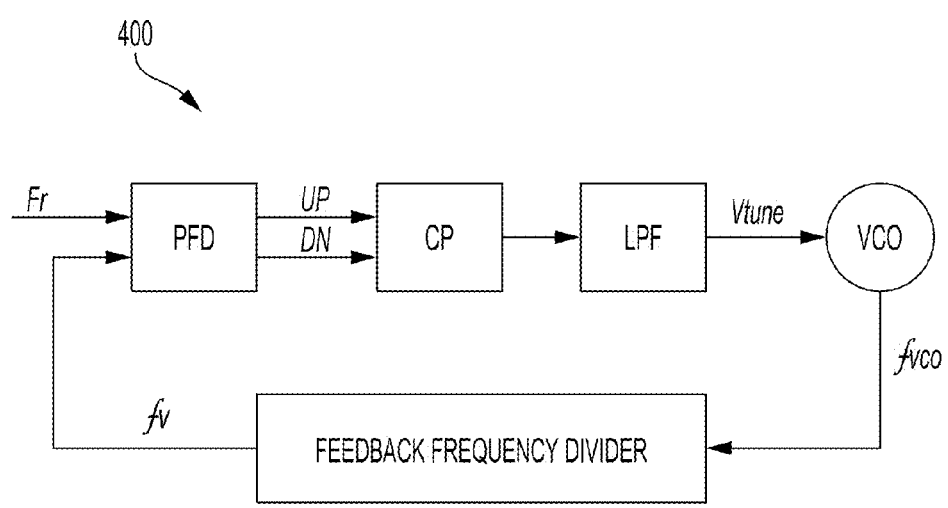
FIG. 4 is a block diagram illustrating an exemplary phase locked loop (PLL) in accordance with aspects of the present disclosure.

FIG. 4 is a block diagram illustrating an exemplary phase locked loop (PLL) 400 in accordance with aspects of the present disclosure. The PLL 400 includes a phase frequency detector (PFD), a charge pump (CP), a filter (e.g., loop filter, such as low pass filter (LPF)), an oscillator (shown by way of example, but without limitation as a voltage controlled oscillator (VCO)), and a feedback frequency divider. The PLL configuration of FIG. 4 is merely exemplary for ease of illustration and understanding. Additional components and/or multiples of the identified components may also be included (e.g., two PFDs). The frequency divider may include a delay block (not shown) and may receive the output of the VCO as an input. Additional inputs, such as the output frequency of the PLL may also be supplied to the frequency divider.

The PFD may compare the frequency divider output to the reference frequency. The PFD may generate an up signal UP and a down signal corresponding to the frequency divider output DN. The UP and DN signals may be supplied to the charge pump. In the charge pump, the pulse width of UP and DN signals may be converted to charge (e.g., pulse width*charge pump current). The charge may be supplied to the filter. The filter may, in some aspects, act as an integrator and may further convert the charge to a VCO tuning voltage for controlling the VCO.

In some aspects, the PLL 400 may further include a delay cell (not shown). The delay cell may produce a fixed delay as a fraction of the input clock period. Additionally, the delay may be stable across process-voltage-temperature and may automatically track the input clock period. The delay cell may be based on a capacitor charged by a fixed current where the charging current is derived from a switched capacitor circuit (e.g., as shown below in FIGS. 5, 6A and 6B). In some aspects, the delay cell may use digital inverters as comparators.

Figure 5:
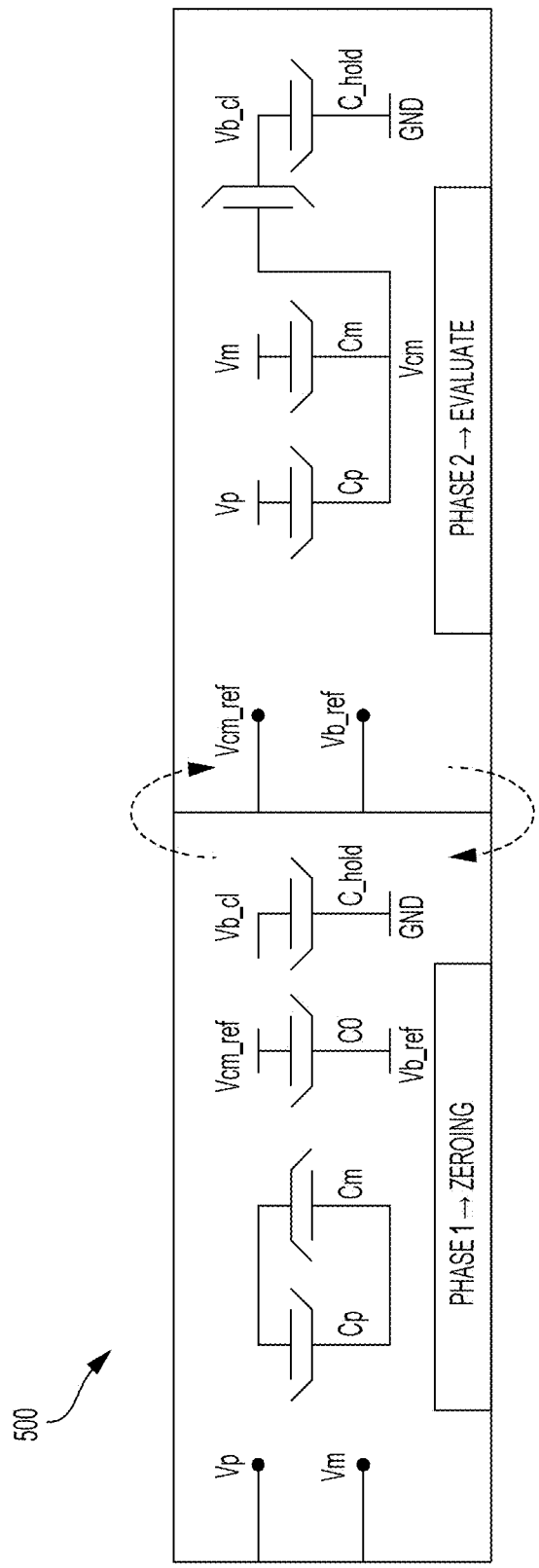
FIG. 5 is a diagram illustrating an exemplary common mode feedback (CMFB) network in accordance with aspects of the present disclosure.

FIG. 5 is a schematic diagram illustrating an exemplary common mode feedback (CMFB) network 500 in accordance with aspects of the present disclosure. Referring to FIG. 5, the CMFB network 500 includes a set of capacitors (Cp, Cm, C0 and C_hold) that are respectively connected according to a phase of operation. The connections may be made via switches (not shown) that are closed or opened in accordance with a duty cycle of a control signal corresponding to the phase of operation. For instance, in a zeroing phase, the switches may be operated to couple the capacitors Cp and Cm together. Instead of simply zeroing out the probe capacitor to a constant charge as in conventional CMFB networks, the charge on the Cp and Cm capacitors are connected in an anti-parallel layout or configuration (e.g., parallel with reverse polarity) to reduce the charge difference between or equalize the charge on the capacitors Cp and Cm in the absolute value. In this way, the charges of the capacitors Cp and Cm may become equal and opposite without losing differential charge. In addition, the capacitor C0 is charged between the common mode reference voltage (Vcm_ref) and the reference bias voltage (Vb_ref). The capacitor C0 then may act as a battery in the evaluation phase. In doing so, it is possible to avoid loading the loop filter of the PLL, for example. The capacitor C_hold is charged by the bias voltage (Vb_cl).

Figure 7:
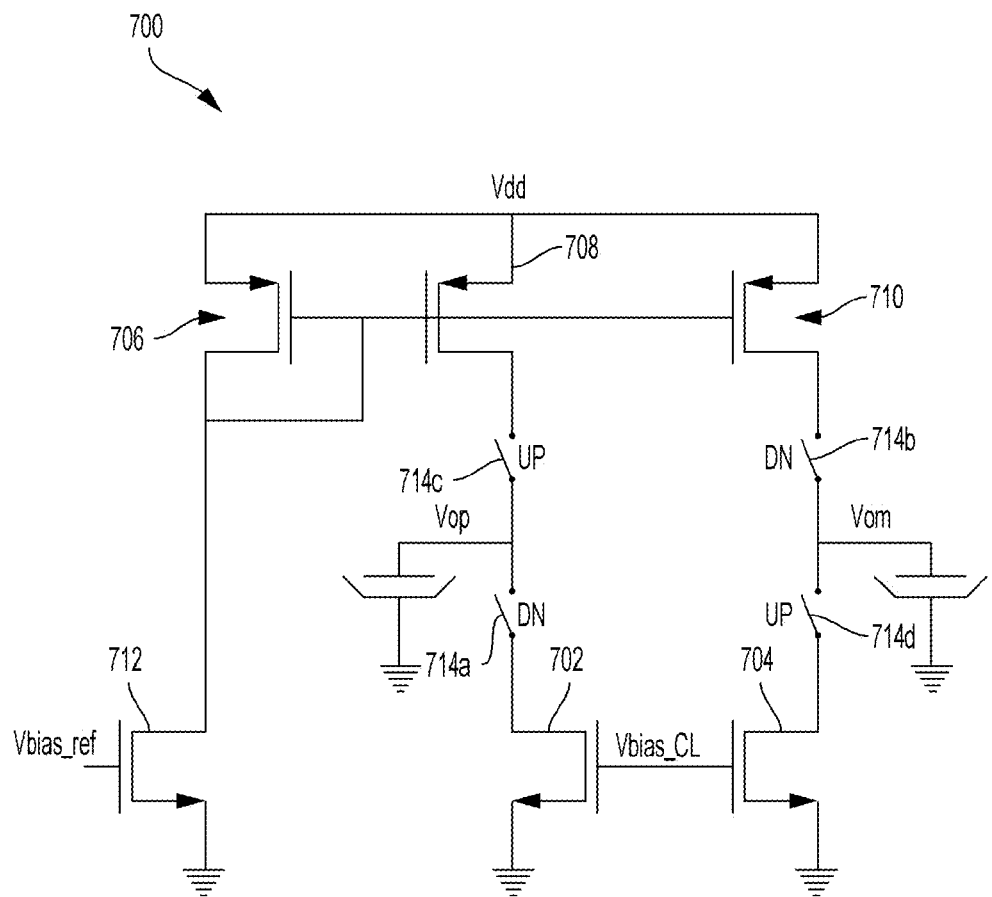
FIG. 7 is a diagram illustrating an exemplary charge pump in accordance with aspects of the present disclosure.

On the other hand, in an evaluation phase, the capacitors (e.g., Cp, Cm, C0 and C_hold) are connected differentially to cause the common mode point (terminal between Cp and Cm) to settle to the actual common mode value. The new bias is evaluated by shifting the evaluated common mode voltage using the precharged capacitor C0, which may be referred to as a battery capacitor. That is, the common mode voltage is level shifted down by the capacitor C0, which acts as a battery fed to a common mode adjustment circuit, such as an n-channel metal-oxide-semiconductor (NMOS) device, for example. In some aspects, the capacitor C_hold may represent the gate of the NMOS device (e.g., elements 702 and 704 as shown in FIG. 7). The NMOS device may feed back current to adjust the common mode voltage at the output node. Of course, the NMOS device is merely exemplary and not limiting. In some implementations, a p-channel metal-oxide-semiconductor (PMOS) current source may be used.

Figure 6A:
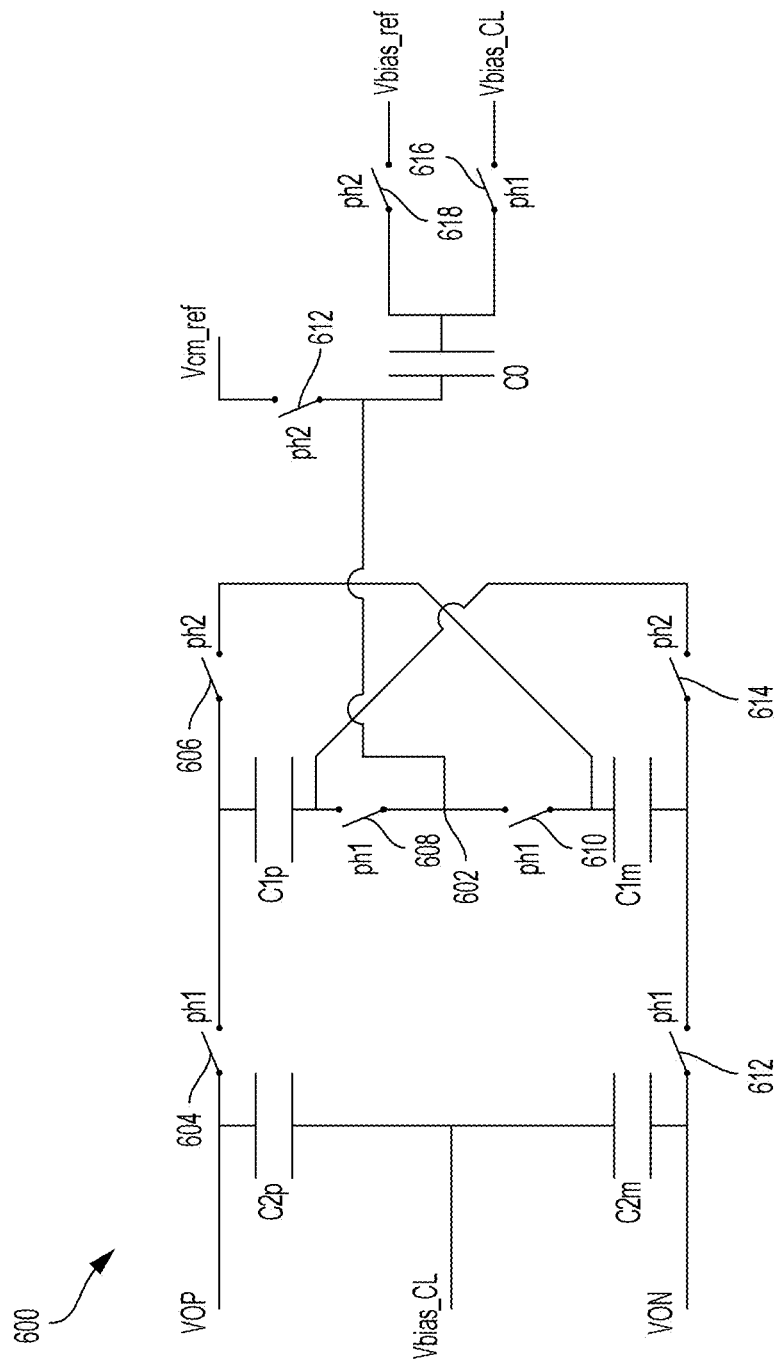
FIGS. 6A and 6B are diagrams illustrating exemplary common mode feedback (CMFB) networks in accordance with aspects of the present disclosure.

FIG. 6A is a diagram illustrating an exemplary common mode feedback (CMFB) network 600 in accordance with aspects of the present disclosure. As shown in FIG. 6A, the CMFB network 600 includes a set of capacitors (e.g., C1p, C1m, C2m, C2p and C0 (battery capacitor)). The CMFB network 600 also includes switches (e.g., elements 604-618) that are respectively controlled according to the duty cycle of control signals PH1 or PH2. PH1 may correspond to the evaluation phase or mode and PH2 may correspond to the zeroing phase or mode, as discussed with reference to FIG. 5.

During the evaluation phase, PH1 is high and PH2 is low and the switches (e.g., 604, 612, 608, 610 and 616) operating according to the PH1 control signal are closed. As such, the capacitors C1m and C1p are in series and the capacitors C2p and C2m are also in series and coupled to the differential terminal (VOP and VON). In doing so, the actual common mode may be sensed at node 602. In some aspects, the differential terminals may comprise the differential output terminals of a high impedance differential circuit such as a charge pump (e.g., the charge pump 700 of FIG. 7), for example. The sensed common mode voltage (e.g., at node 602) may be level shifted to the battery capacitor C0 and used to adjust the common mode voltage at the output node to a desired common mode voltage. In other words, the actual common mode voltage error is measured (e.g., sensed) and level shifted to the nominal bias level. If, for example, the common mode voltage exceeds the desired voltage, the voltage at the battery capacitor C0 may be applied (Vbias_CL) to pull down the common mode voltage to the desired voltage. Conversely, if, for example, the common mode voltage is below the desired voltage, the voltage at the battery capacitor C0 may be applied (Vbias_CL) to pull up the common mode voltage to the desired voltage. The voltage Vbias_CL is the applied feedback voltage at the adjustment circuit (e.g., the gate of the current source transistor (e.g., elements 702 and 704 shown in FIG. 7).

During the zeroing phase, PH2 is high, PH1 is low, and the switches (e.g., 606, 614, 612 and 618) operating according to the PH2 control signal are closed. As such, the capacitor C0 is charged between voltage Vcm_ref (reference common mode) and Vbias_ref (nominal closed loop bias). Capacitors C1p and C1m are connected in anti-parallel. The differential voltage across these capacitors remains and is then forced to be equal and opposite. Accordingly, during the next phase (PH1), when the capacitors are placed across the load, the difference between the differential voltage across the capacitors (e.g., C1m and C2m) and voltage across the output node is reduced. In other words, the CMFB network 600 maintains differential charge between the evaluation phase and the zeroing phase. Thus, differential loading of the output node may be reduced.

Figure 6B:
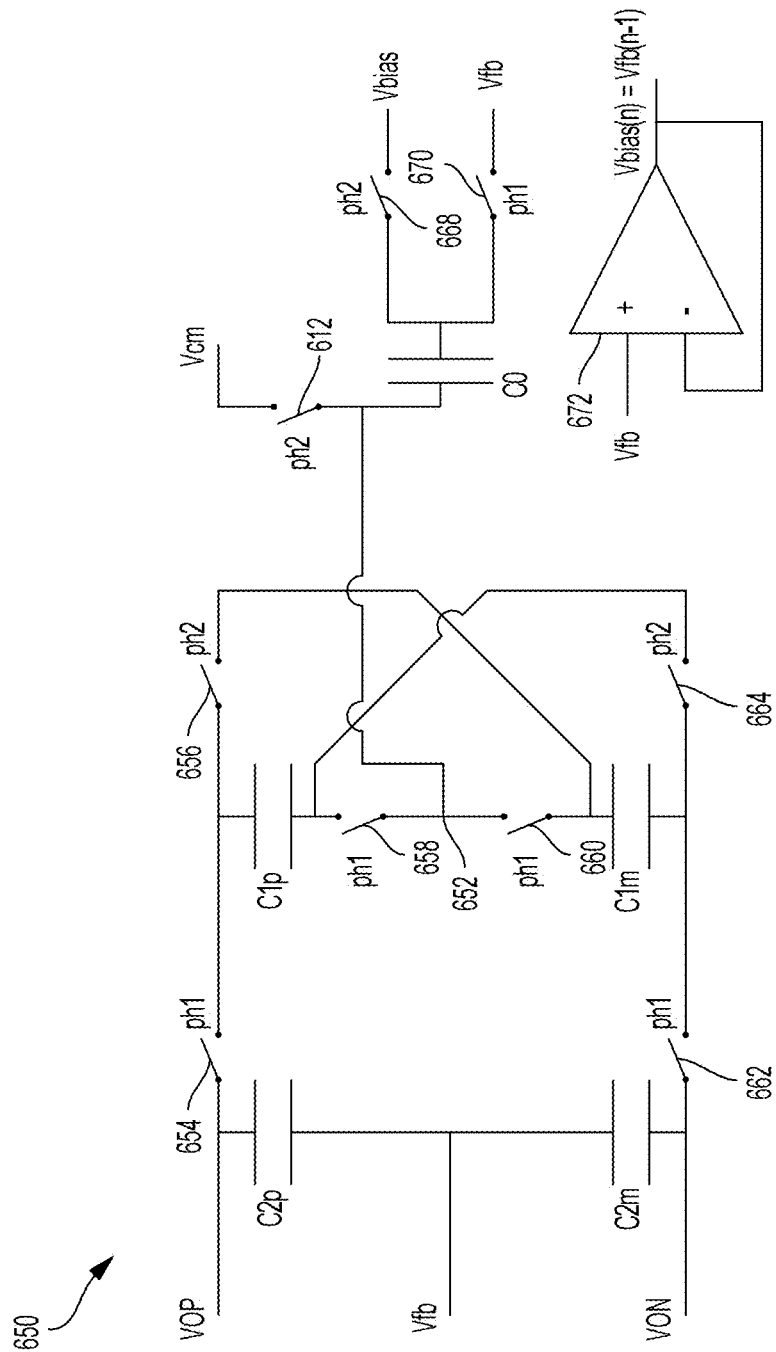

FIG. 6B is a diagram illustrating an exemplary common mode feedback (CMFB) network 650 in accordance with aspects of the present disclosure. As shown in FIG. 6B, the CMFB network 650 is similar to the CMFB network 600 but incorporates a buffer 672 to derive the Vbias_ref from a previous value of the voltage feedback Vfb (e.g., Vbias_CL during a previous cycle or phase of operation). The CMFB network 650 includes a set of capacitors (e.g., C1p, C1m, C2m, C2p and C0 (battery capacitor)). The CMFB network 650 also includes switches (e.g., elements 654-670) that are respectively controlled according to the duty cycle of control signals PH1 or PH2. PH1 may correspond to the evaluation phase or mode and PH2 may correspond to the zeroing phase or mode, as discussed with reference to FIG. 5.

During the evaluation phase, PH1 is high and PH2 is low and the switches (e.g., 654, 662, 658, 660 and 670) operating according to the PH1 control signal are closed. As such, capacitors C1m and C1p are in series and capacitors C2p and C2m are also in series and coupled to the differential terminal (VOP and VON). In doing so, the actual common mode may be sensed at node 652. In some aspects, the differential terminals may comprise the differential output terminals of a high-impedance differential circuit such as a charge pump, for example. The sensed common mode voltage (e.g., at node 652) may be level shifted to the battery capacitor C0 and used to adjust the common mode voltage at the output node to a desired common mode voltage. In other words, the actual common mode voltage is measured (e.g., sensed). Accordingly, the common mode voltage may be adjusted using the Vbias_CL. However, in this example, the buffer 672 takes as input the feedback voltage Vfb and derives the Vbias based on a value of Vbias_CL of the previous cycle or phase of operation. That is, Vbias_CL may be given by Vbias_CL(n)=Vfb(n−1). As such, the buffer 672 is used to charge the battery capacitor C0 between the common mode voltage reference Vcm and the applied bias (Vbias_CL) in a previous cycle or phase of operation.

Capacitors C2$p$, C2$m$ and the capacitor at Vfb hold the closed loop control voltage between two consecutive control signals PH1. Additionally capacitors C2$p$ and C2$m$ provide a high frequency negative feedback path for high frequency, fast common mode disturbances. Accordingly, the steady state offset error due to charge sharing between the series connection of the battery capacitor C0 and C1$p$/C1$m$ and the capacitor at Vfb may be reduced. In this way, the gain of the CMFB network 650 may be improved.

FIG. 7 is a diagram illustrating an exemplary charge pump 700 in accordance with aspects of the present disclosure. As shown in FIG. 7, the charge pump includes transistors 702, 704, 706, 708, 710 and 712. The charge pump 700 also includes a set of switches, which are operated according to control signals UP and DN. The bias voltage (Vbias_CL) is applied at the gate of the transistors 702 and 704 (e.g., NMOS device). When the sensed common mode voltage exceeds the desired voltage, the voltage at the battery capacitor C0 of FIGS. 6A and 6B (Vbias_CL) may be level shifted to the gate of the transistors 702 and 704. Switches 714$a$ and 714$b$ may be closed under the control of the DN signal and switches 714$c$ and 714$d$ may be closed under the control of the UP signal allowing the updated bias voltage at Vbias_CL to decrease the charge pump current such that the common mode voltage may be pulled down to the desired voltage. That is, both UP and DN switches (e.g., 714$a$, 714$b$, 714$c$, and 714$d$) are open to allow common mode correction. On the other hand, when the sensed common mode voltage is below the desired voltage, Vbias_CL may be level shifted to the gate of the transistors 702 and 704. Switches 714$a$ and 714$b$ may be closed under the control of the DN signal and switches 714$c$ and 714$d$ may be closed under the control of the UP signal allowing the updated bias voltage at Vbias_CL to increase the charge pump current such that the common mode voltage may be pulled up to the desired voltage.

The charge pump may supply or dump a differential charge in proportion to the pulse width of UP/DN control signals. When switches 714$c$ and 714$d$ (e.g., UP switches) are on (e.g., closed), positive current flows into the capacitor Vop (also referred to as VOP) and negative current (current out of capacitor to ground) flows in to Vom (also referred to as Von) for the duration of the pulse width, thus depositing a positive differential charge into the capacitors proportional to the UP control signal pulse width. The polarity of current and hence the charge is reversed for DN. That is, when switches 714$a$ and 714$b$ (e.g., DN switches) are on (e.g., closed), negative current flows into the capacitor Vop and positive current flows in to Vom for the duration of the pulse width, thus depositing a negative differential charge in to the capacitors proportional to the DN control signal pulse width.

Figure 8:
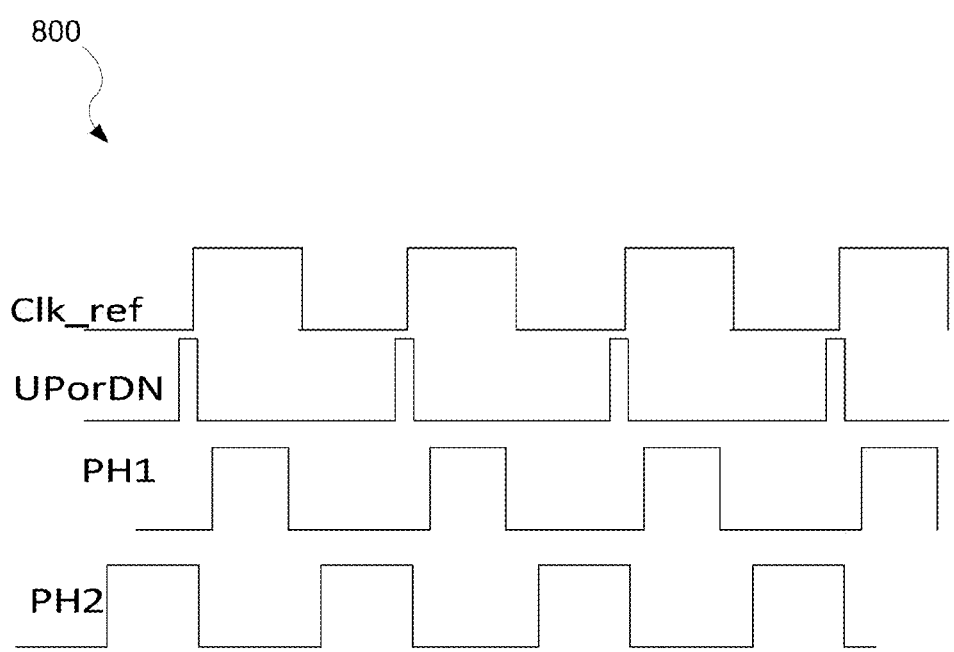
FIG. 8 is an exemplary timing diagram in accordance with aspects of the present disclosure.

FIG. 8 is an exemplary timing diagram 800 in accordance with aspects of the present disclosure. Referring to FIG. 8, the timing corresponding to the duty cycles of control signals PH1 and PH2 for operating the switches shown in FIGS. 6A and 6B is provided. In some aspects, the duty cycles of control signals PH1 and PH2 may be alternating such that PH1 and PH2 are not at the same state at the same time. That is, when PH1 is high, PH2 is low and vice versa. In this way, the corresponding switches shown in FIGS. 6A and 6B may be operated according to the evaluation phase or the zeroing phase. Thus, in this example, the CMFB network is active when the charge pump is inactive. As such, the CMFB network may be less sensitive to differential mismatch between probe capacitors.

The transition between PH1 and PH2 is triggered by a falling or inactive edge of the reference clock Clk_ref and a falling edge of the UP and/or DN control signal. The UP/DN control signals are generated by the phase frequency detector (PFD) based on phase error between the reference and the feedback clock of the PLL with a minimum non-zero pulse width for each signal.

Figure 9:
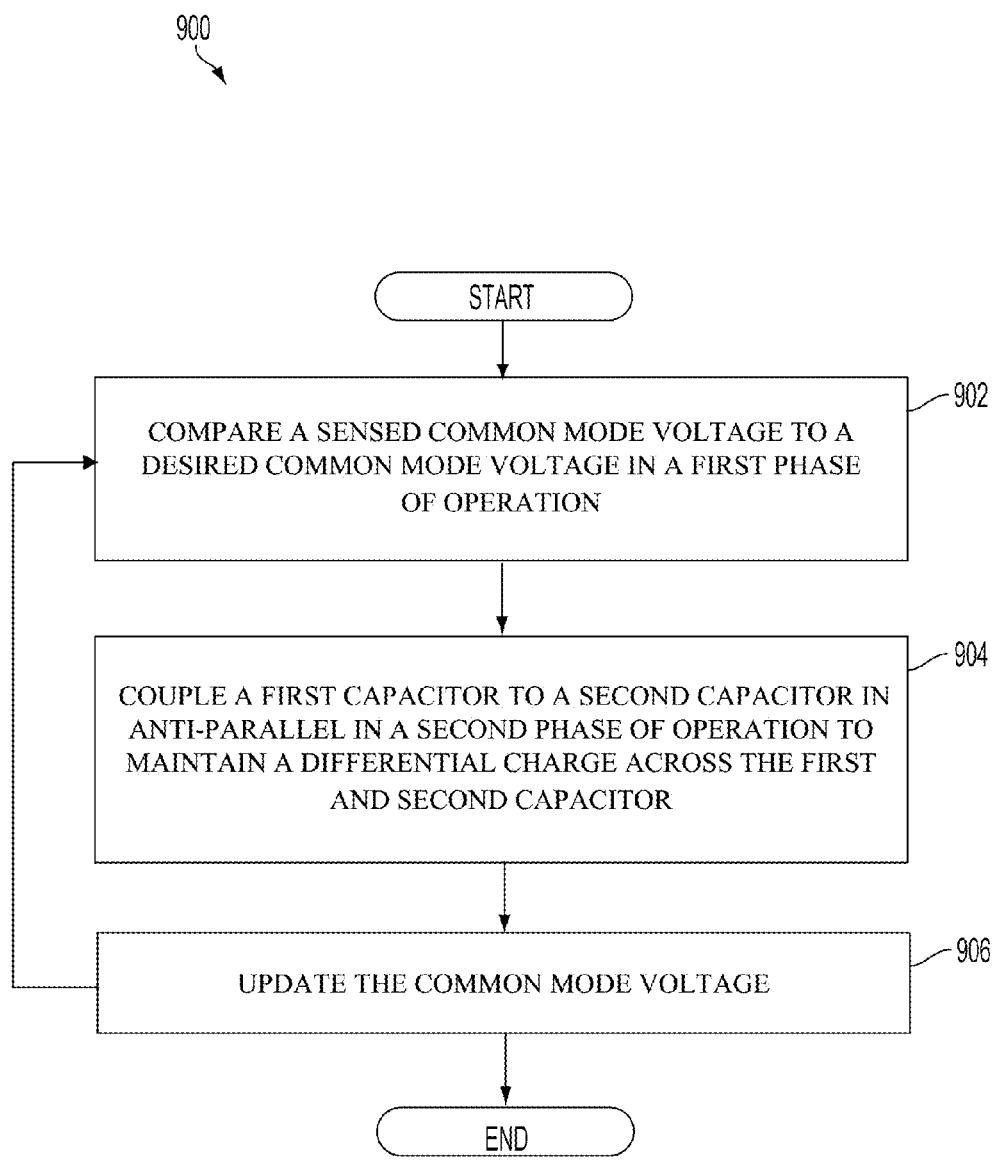
FIG. 9 is a process flow diagram illustrating a method according to an aspect of the present disclosure.

FIG. 9 is a process flow diagram illustrating a method 900 in accordance with aspects of the present disclosure. At block 902, the process compares a sensed common mode voltage to a desired common mode voltage in a first phase of operation.

At block 904, the process couples a first capacitor to a second capacitor in an anti-parallel configuration in a second phase of operation to maintain a differential charge across the first and second capacitors. For example, as shown in FIG. 6A, the CMFB network 600 includes switches that may couple the capacitor C1$p$ to the capacitor C1$m$ in an anti-parallel configuration (parallel with reverse polarity) under control of the control signal PH2.

Furthermore, at block 906, the process updates the common mode voltage based on the comparison of the sensed common mode voltage and the desired common mode voltage. The update may be conducted during the second phase of operation. In some aspects, the process may further apply a bias voltage to a common mode correction point in a high impedance differential circuit. By way of example only, referring to FIG. 7, a bias voltage (Vbias_CL) may be applied to the gate of a transistor (e.g., 702, 704) in the charge pump 700. A current is generated based on the applied bias voltage to adjust the common mode voltage to the desired common mode voltage. The process may then be repeated, returning to block 902. In this way, the desired common mode voltage may be maintained. Thereafter, the process may repeat in a looped manner.

According to a further aspect of the present disclosure, a switched capacitor common mode feedback circuit is described. The switched capacitor common mode feedback (CMFB) network includes means for comparing a sensed common mode voltage to a desired common mode voltage in a first phase of operation. The means for comparing may, for example, comprise the capacitors (e.g., C2$p$, C2$m$, C1$p$, C1$m$, and C0) and switches, as shown in FIGS. 6A and 6B. The switched capacitor CMFB network also includes means for coupling a first capacitor to a second capacitor in anti-parallel in a second phase of operation to maintain a differential charge across the first and second capacitors. The means for coupling may, for example, comprise switches (e.g., 606 and 614) shown in FIG. 6A. The switched capacitor CMFB network also includes means for updating the common mode voltage based on the comparing during the second phase of operation. The means for updating may, for example, comprise the battery capacitor C0 and switches (e.g., 608, 610, and 612) shown in FIG. 6A, the battery capacitor C0 and switches (e.g., 658, 660, and 662) shown in FIG. 6B and transistors 702, 704 shown in FIG. 7. In another aspect, the aforementioned means may be any layer, module, or any apparatus configured to perform the functions recited by the aforementioned means.

Figure 10:
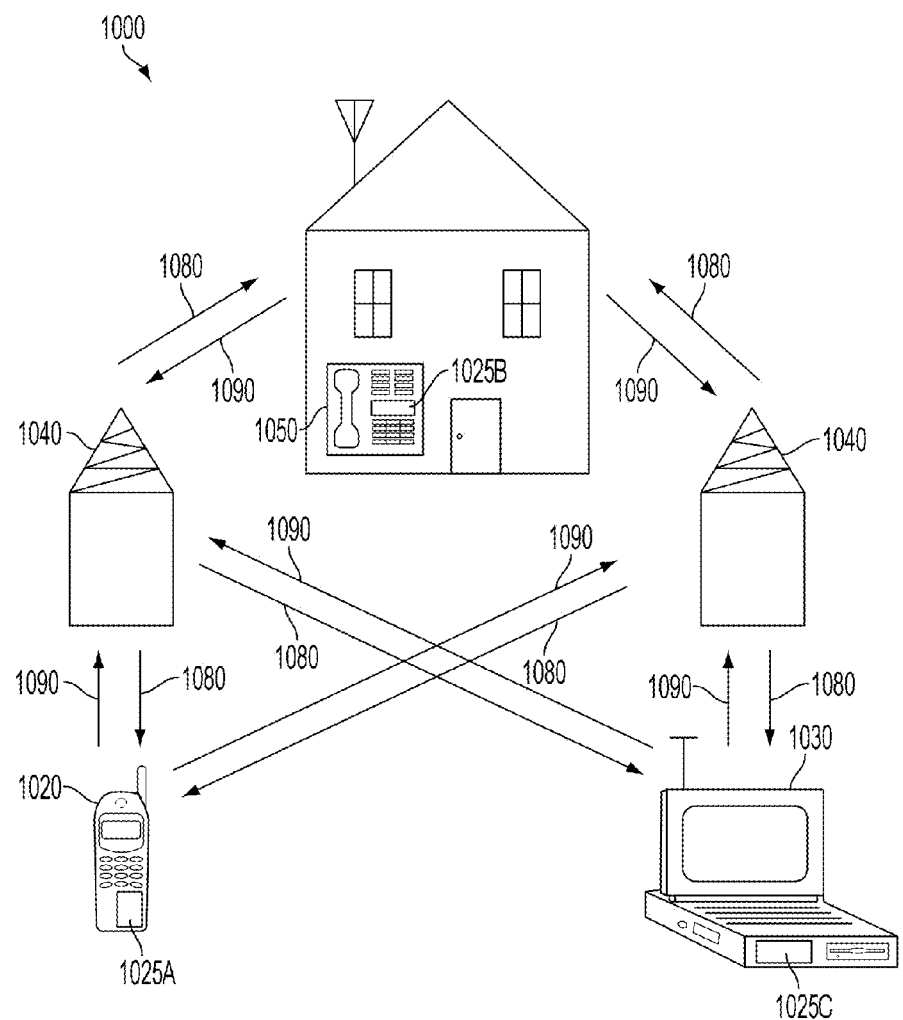
FIG. 10 is a block diagram showing an exemplary wireless communication system in which an aspect of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B having the disclosed switched capacitor CMFB network. It will be recognized that other devices may also include the disclosed switched capacitor CMFB network, such as the base stations, user equipment, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed switched capacitor CMFB network.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. Accordingly, the scope of the present disclosure is intended to be defined only by reference to the appended claims.

What is claimed is:

1. A switched capacitor circuit, comprising:
a first capacitor coupled in series with a second capacitor in a first mode of operation across differential output terminals of a circuit, and coupled in an anti-parallel layout in a second mode of operation; and
a third capacitor coupled on a first side to a common node of the first capacitor and the second capacitor and on a second side to a current source control voltage in the first mode of operation, and coupled between a bias reference voltage and a common mode reference voltage in the second mode of operation.

2. The switched capacitor circuit of claim 1, further comprising a fourth capacitor coupled in series with a fifth capacitor, the fourth capacitor coupled across a first of the differential output terminals of the circuit and the current source control voltage, the fifth capacitor coupled across a second of the differential output terminals of the circuit and the current source control voltage.

3. The switched capacitor circuit of claim 1, further comprising a first set of switches and a second set of switches, the first set of switches controlled to couple the first capacitor to the second capacitor in the second mode of operation, and the second set of switches controlled to couple the first capacitor to the second capacitor and couple the third capacitor on the first side to the common node of the first capacitor and the second capacitor and on the second side to the current source control voltage in the first mode of operation.

4. The switched capacitor circuit of claim 1, in which the circuit comprises a high impedance differential circuit.

5. The switched capacitor circuit of claim 1, further comprising a buffer to charge the third capacitor, and in which the third capacitor is charged between the common mode reference voltage and an applied bias voltage in a previous phase of operation.

6. A phase locked loop (PLL) circuit, comprising:
a first circuit having differential output terminals; and
a switched capacitor circuit comprising:
a first capacitor coupled in series with a second capacitor in a first mode of operation across the differential output terminals of the first circuit, and coupled in an anti-parallel layout in a second mode of operation; and
a third capacitor coupled on a first side to a common node of the first capacitor and the second capacitor and on a second side to a current source control voltage in the first mode of operation, and coupled between a bias reference voltage and a common mode reference voltage in the second mode of operation.

7. The PLL circuit of claim 6, further comprising a fourth capacitor coupled in series with a fifth capacitor, the fourth capacitor coupled across a first of the differential output terminals of the first circuit and the current source control voltage, the fifth capacitor coupled across a second of the differential output terminals of the first circuit and the current source control voltage.

8. The PLL circuit of claim 6, further comprising a first set of switches and a second set of switches, the first set of switches controlled to couple the first capacitor to the second capacitor in the second mode of operation, and the second set of switches controlled to couple the first capacitor to the second capacitor and couple the third capacitor on the first side to the common node of the first capacitor and the second capacitor and on the second side to the current source control voltage in the first mode of operation.

9. The PLL circuit of claim 6, in which the first circuit comprises a high impedance differential circuit.

10. The PLL circuit of claim 6, further comprising a buffer to charge the third capacitor, and in which the third capacitor is charged between the common mode reference voltage and an applied bias voltage in a previous phase of operation.

11. The PLL circuit of claim 6, further comprising a delay cell to produce a fixed delay as a fraction of an input clock period.

12. The PLL circuit of claim 11, in which the fixed delay is based at least in part on a fixed current derived for the switched capacitor circuit.

* * * * *